US009235079B2

(12) United States Patent
Onaka et al.

(10) Patent No.: US 9,235,079 B2
(45) Date of Patent: Jan. 12, 2016

(54) COLOR FILTER SUBSTRATE AND FRINGE-FIELD SWITCHING MODE LIQUID CRYSTAL DISPLAY USING SAME

(71) Applicant: TOPPAN PRINTING CO., LTD., Tokyo (JP)

(72) Inventors: Nozomi Onaka, Tokyo (JP); Yasuhiro Hibayashi, Tokyo (JP); Hidesato Hagiwara, Tokyo (JP); Kenzo Fukuyoshi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 328 days.

(21) Appl. No.: 13/870,717

(22) Filed: Apr. 25, 2013

(65) Prior Publication Data
US 2013/0235311 A1 Sep. 12, 2013

Related U.S. Application Data

(63) Continuation of application No. PCT/JP2011/074285, filed on Oct. 21, 2011.

(30) Foreign Application Priority Data

Oct. 28, 2010 (JP) ................................ 2010-242665

(51) Int. Cl.
*G02F 1/1333* (2006.01)
*G02F 1/1335* (2006.01)
(Continued)

(52) U.S. Cl.
CPC .......... *G02F 1/133514* (2013.01); *C08L 63/00* (2013.01); *C08L 63/10* (2013.01);
(Continued)

(58) Field of Classification Search
CPC .............. G02F 1/133512; G02F 1/133514; G02F 1/133516; G02F 2001/133519; G02F 2001/134372; G02B 5/223; G03F 7/0007; C08L 63/00; C08L 63/10
USPC .................................................. 349/106–110
See application file for complete search history.

(56) References Cited

U.S. PATENT DOCUMENTS

| | | | | |
|---|---|---|---|---|
| 5,558,927 A * | 9/1996 | Aruga et al. | ............... | 428/195.1 |
| 6,826,001 B2 * | 11/2004 | Funakura et al. | ............. | 359/885 |
| 2008/0043180 A1 | 2/2008 | Hagiwara et al. | | |
| 2010/0188630 A1 * | 7/2010 | Goebel et al. | ................. | 349/139 |

FOREIGN PATENT DOCUMENTS

| | | |
|---|---|---|
| EP | 0622644 A1 | 11/1994 |
| EP | 0833187 A1 | 4/1998 |

(Continued)

OTHER PUBLICATIONS

Extended European Search Report dated Aug. 18, 2014 in corresponding European Patent Application No. 11836153.4.
(Continued)

*Primary Examiner* — Paisley L Arendt

(57) ABSTRACT

A color filter substrate for use in a fringe-field switching mode liquid crystal display wherein the color filter substrate and an array substrate provided with a comb-shaped pixel electrode having an electrode width of 10 μm or less are arranged facing each other with a liquid crystal layer interposed therebetween. The color filter substrate comprises a transparent substrate, a black matrix provided on the transparent substrate, includes an organic pigment as a main coloring agent, color pixels having a relative dielectric constant of 2.9 or more but 4.4 or less, and a transparent resin layer provided on the color pixels. The relative dielectric constant of each of the color pixels falls within ±0.3 of an average relative dielectric constant of the color pixels.

16 Claims, 5 Drawing Sheets

(51) Int. Cl.
*G02B 5/20* (2006.01)
*G02F 1/1343* (2006.01)
*C08L 63/00* (2006.01)
*G03F 7/00* (2006.01)
*C08L 63/10* (2006.01)
*C09B 67/04* (2006.01)
*C09B 67/22* (2006.01)
*C09B 67/46* (2006.01)
*G02B 5/22* (2006.01)

(52) U.S. Cl.
CPC ........ *C09B 67/0002* (2013.01); *C09B 67/0033* (2013.01); *C09B 67/0041* (2013.01); *C09B 67/0085* (2013.01); *G02B 5/201* (2013.01); *G02F 1/134363* (2013.01); *G03F 7/0007* (2013.01); *G02B 5/223* (2013.01); *G02F 1/133512* (2013.01); *G02F 2001/133519* (2013.01); *G02F 2001/134372* (2013.01)

(56) References Cited

FOREIGN PATENT DOCUMENTS

| | | |
|---|---|---|
| JP | 09-292514 | 11/1997 |
| JP | 2009-229826 | 10/2009 |
| JP | 2011-75642 | 4/2011 |
| JP | 2011-154327 | 8/2011 |
| JP | 2011-221251 | 11/2011 |
| WO | WO 94/07158 | 3/1994 |

OTHER PUBLICATIONS

International Search Report mailed Jan. 24, 2012 in corresponding Interntational Application No. PCT/JP2011/074285.
PCT International Preliminary Report on Patentability mailed May 23, 2013 in corresponding International Application No. PCT/JP2011/074285.

\* cited by examiner

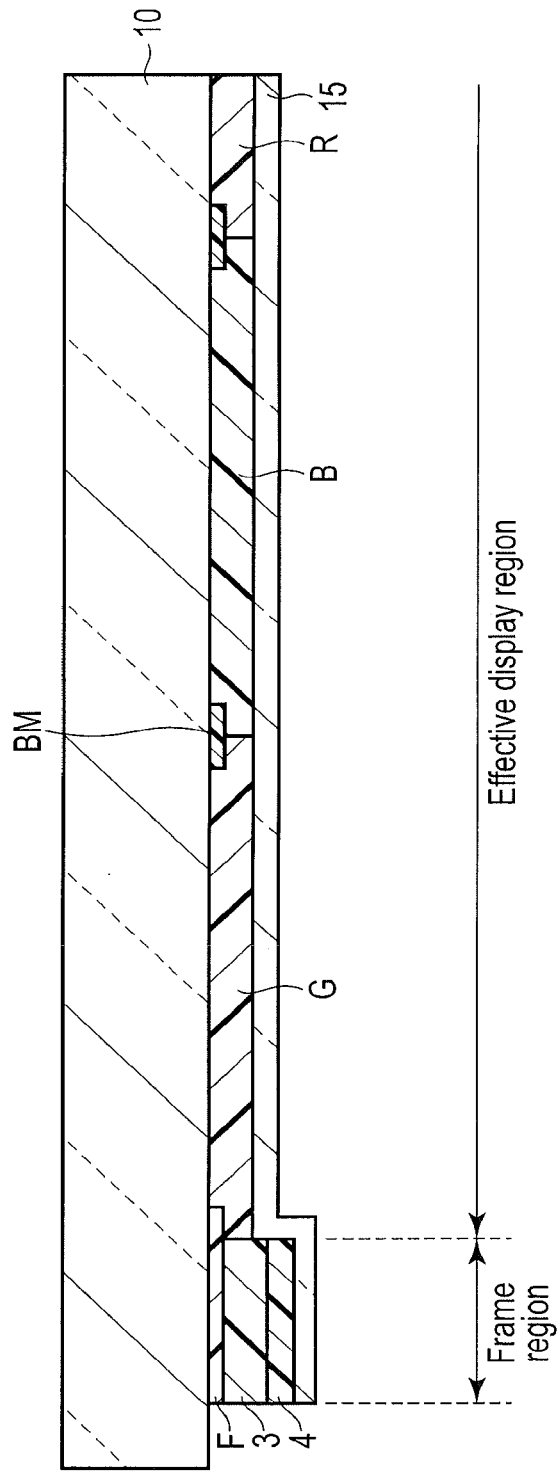
F I G. 4

COLOR FILTER SUBSTRATE AND FRINGE-FIELD SWITCHING MODE LIQUID CRYSTAL DISPLAY USING SAME

CROSS REFERENCE TO RELATED APPLICATIONS

This application is a Continuation Application of PCT Application No. PCT/JP2011/074285, filed Oct. 21, 2011 and based upon and claiming the benefit of priority from prior Japanese Patent Application No. 2010-242665, filed Oct. 28, 2010, the entire contents of all of which are incorporated herein by reference.

BACKGROUND OF THE INVENTION

1. Field of the Invention

The present invention relates to a color filter substrate for fringe-field switching mode liquid crystal display and a fringe-field switching mode liquid crystal display in which the color filter substrate is used.

2. Description of the Related Art

Recently, an in-plane switching mode liquid crystal display in which the initial alignment of liquid crystal is horizontal to the surface of a substrate and in which the liquid crystal is rotated horizontally to the substrate surface and a novel fringe-field switching mode liquid crystal display designed to attain an enhanced transmittance have been proposed and are being marketed. These liquid crystal displays are used in a normally black mode (when no driving voltage applied, the liquid crystal horizontally aligned; crossed nicols used as the polarizer), and realize a wide viewing angle and a high contrast, so that they are becoming a mainstream display for use in large-size TVs and mobile devices.

The fringe-field switching (hereinafter referred to as FFS) mode liquid crystal display can realize higher transmittance and higher displayed image quality than those of the conventional in-plane switching mode liquid crystal display. However, the requirement for the electrical properties, especially relative dielectric constant, of color filter and other members, including an insulating layer between the pixel electrode for driving the liquid crystal and the common electrode, for use in the fringe-field switching mode liquid crystal display is becoming severe.

The difference between the in-plane switching mode liquid crystal display and the fringe-field switching liquid crystal display will be described with reference to FIG. 1 and FIG. 2.

FIG. 1 shows a cross section of the in-plane switching mode liquid crystal display. The in-plane switching mode liquid crystal display is so constructed that a color filter substrate 40 and an array substrate 50 are arranged facing each other and stuck together with a liquid crystal layer 46 interposed therebetween. Pixel electrodes 51 and common electrodes 52 are provided on the array substrate 50 with an insulating layer 22 interposed therebetween. The pixel electrodes 51 and the common electrodes 52 are wiring layers comprised of a highly conductive material, such as a metal. They are often provided in a comb-shaped pattern with a pitch of tens of microns. In the liquid crystal layer 46, use is made of a liquid crystal that makes an initial alignment horizontal to the surface of the substrate and exhibits positive dielectric constant anisotropy.

FIG. 1 shows the state of "white display" in which, for example, a liquid-crystal-driving voltage of 5 V is applied between the pixel electrodes 51 and the common electrodes 52. Electric field is applied in a lateral direction as indicated by a line of electric force 43 in FIG. 1, so that the liquid crystal molecules between the pixel electrodes 51 and the common electrodes 52 are horizontally rotated by the applied voltage. The liquid crystal molecules 47 close to the substrate surface cannot attain satisfactory rotation because of a strong restraining force of rubbing on the alignment film. In FIG. 1, not only the liquid crystal molecules 48 on the pixel electrodes 51 but also the liquid crystal molecules 49 on the common electrodes 52 remain in the initial horizontal alignment and are not rotated because the application of the voltage for rotating the liquid crystal molecules is poor (liquid crystal molecules 49 are oriented in the direction perpendicular to the sheet). This means that even when, for example, the pixel electrodes 51 and the common electrodes 52 are formed of a transparent conductive film, such as ITO, liquid crystal molecules that do not rotate regardless of the application of a driving voltage are left, causing a lowering of transmittance.

FIG. 2 shows a cross section of the fringe-field switching liquid crystal display. The fringe-field switching liquid crystal display is so constructed that a color filter substrate 40 and an array substrate 60 are arranged facing each other and stuck together with a liquid crystal layer 56 interposed therebetween. Pixel electrodes 61 and a common electrode 62 are provided on the array substrate 60 with an insulating layer 22 interposed therebetween. Both the pixel electrodes 61 and the common electrode 62 are formed of a transparent conductive film, such as ITO. A characteristic feature of this electrode structure is that within a pixel, the common electrode 62 is provided in a solid planar form, while the pixel electrodes 61 are provided very finely with an electrode width (WL) of about 2 to 10 μm and with a pitch of 15 μm or less.

For example, the pixel electrodes 61 can be provided with an electrode width (WL) of 5 μm and a pitch of 11 μm. The smaller the electrode width (WL) and pitch of the pixel electrodes 61 are, the greater the contribution to the increase of the transmittance of the liquid crystal display is. The reason therefor is that the fringe electric field provided from the pattern edges of the pixel electrodes 61 to the common electrode 62 is the agent of liquid crystal drive. When the electrode width (WL) is, for example, 2 μm, rendering the inter-electrode distance (Ws) a little bit large, about 3 μm, realizes high efficiency from the viewpoint of transmittance.

In the liquid crystal layer 56 shown in FIG. 2, liquid crystal molecules are rotated across substantially all the area within the pixel by the application of a liquid crystal driving voltage between the pixel electrodes 61 and the common electrode 62, thereby realizing a display of high transmittance. In a liquid crystal display device in which a liquid crystal of initial horizontal alignment is used, the FFS mode can be regarded as means for transmittance enhancement by the generation of fringe electric field at a short cycle.

Known technologies relating to the color filter for in-plane switching mode liquid crystal display are disclosed in Jpn. Pat. Appln. KOKAI Publication No. (hereinafter referred to as JP-A-) 2009-229826 and JP-A-H9-292514. The technology disclosed in JP-A-2009-229826 comprises specifying the dielectric dissipation factor and chromaticity of a color filter applicable to an in-plane switching mode liquid crystal display. The relative dielectric constant required for the in-plane switching mode is claimed therein. However, there is no disclosure of particular values with respect to the relative dielectric constant of each of red, green and blue color layers, and there is no disclosure with respect to a requisite average of relative dielectric constant and an extent of variation thereof.

Therefore, naturally, no attention is drawn to the respective dielectric constants to be uniformly exhibited by red, green and blue color layers, which are required at the time of halftone display. Moreover, there is no disclosure at all with respect to the influence of the dielectric constant of a black matrix usually provided for ensuring contrast at the time of color display by such color pixels. There is no description with respect to the relative dielectric constant of a color filter needed in the fringe-field switching mode liquid crystal display that while realizing a high-transmittance display, requires high-level electrical properties on liquid-crystal-surrounding members. Further, no study is made with respect to the liquid crystal driving frequency (120 Hz, 240 Hz) prevailing in liquid crystal televisions in which the in-plane switching mode or fringe-field switching mode is employed. The relative dielectric constant at the frequency is not disclosed. The electrical properties of liquid-crystal-surrounding members often change the values thereof in low-frequency regions and high-frequency regions, so that they should be measured in actual use conditions.

In the structuring of the color filter described in JP-A-2009-229826, an overcoat layer comprised of a transparent resin layer is avoided. In the FFS mode liquid crystal display device, an overcoat layer comprised of a transparent resin layer must be provided on the color layer of the color filter thereof. The reason therefor is that there are extremely high-level requirements with respect to the voltage holding ratios of liquid crystal materials for use in the FFS mode, and that in order to avoid any lowering of voltage holding ratio attributed to any adverse effect of impurity ions contained in an organic pigment of the color layer, it is essential to provide an overcoat layer comprised of a transparent resin layer.

JP-A-H9-292514 discloses a color film whose relative dielectric constant is 4.5 or below, and in paragraph 0014 discloses a pigment black 7 comprised of carbon as a black pigment of black matrix. However, with respect to the color films disclosed in FIG. 3 of JP-A-H9-292514, for example, the relative dielectric constant at a frequency of 100 Hz of blue color film can be read as about 3.9, that of red color film as about 3.45 and that of green color film as about 3.1. The variation of relative dielectric constant is large, so that the color films can be applied to the conventional in-plane switching mode liquid crystal display but cannot be applied to the display of high image quality by fringe-field switching mode liquid crystal display. JP-A-H9-292514 does not disclose any concept of uniformizing the relative dielectric constants of individual color films. Further, there is no disclosure with respect to any impact of the relative dielectric constant of black matrix on the FFS mode liquid crystal display device.

BRIEF SUMMARY OF THE INVENTION

Technical Problem

In the FFS mode liquid crystal display device, the relative dielectric constants of color filter members must be uniformized. When there is a large variation of relative dielectric constant as in, for example, the color layers disclosed in FIG. 3 of JP-A-H9-292514, there is a problem that the transmittance of a pixel of high relative dielectric constant becomes lower than those of other pixels at the time of gradation display, thereby causing a color unbalance. In the black matrix used for contrast improvement, generally, carbon is used as a light-shielding (black) coloring agent. The relative dielectric constant of the black matrix containing carbon as a main pigment is as extremely large as 10 to 40. The relative dielectric constant of the black matrix capable of realizing light shielding properties (optical density) required for the frame pattern surrounding an effective display region of liquid crystal generally exhibits a large value, such as about 30. When use is made of such a black matrix exhibiting a large relative dielectric constant, the FFS mode liquid crystal display device encounters a problem that at the time of intermediate display, such as low gradation, light leakage occurs at a border of black matrix and color layer. This is because at the time of driving-voltage-application, an equipotential line that should be originally uniform within a pixel is deformed by an adverse effect of the high relative dielectric constant of the black matrix, resulting in the observation of light leakage around the black matrix.

In the FFS mode liquid crystal display device, because of its high image quality, color unevenness, such as red unevenness or white unevenness, tends to be observed. A cause of this color unevenness is the leaching of ionic impurities from a color layer into the liquid crystal. The leaching of ionic impurities can be nearly solved by covering the color layer with a highly purified transparent resin layer as an overcoat layer. However, it is difficult to solve the difference in relative dielectric constant attributed to different organic pigment species between individual color layers by covering with an overcoat layer only. For example, a halogenated copper phthalocyanine pigment used as a green pigment increases the relative dielectric constant of a green pixel comprising the same as a coloring agent, resulting in a slight lowering of the transmittance of the green pixel, so that a problem of poor display, such as red unevenness, arises.

In the FFS mode liquid crystal display device, use is made of, for example, a liquid crystal whose dielectric constant anisotropy ranges from 3.2 to 7. A liquid crystal whose dielectric constant anisotropy is about 5 on the large side is often used in order to lower the threshold voltage or to shorten the response time (rise of liquid crystal). When a dielectric constant material whose dielectric constant anisotropy is larger than the value of dielectric constant anisotropy of this liquid crystal is used as a color filter member, problems, such as the above-mentioned color unevenness and light leakage, are likely to arise. A bad example thereof is the above-mentioned light leakage experienced when a black matrix of high relative dielectric constant is employed in a color filter.

The present invention has been made in these circumstances. It is an object of the present invention to provide a color filter substrate suitable for FFS mode liquid crystal display device that can ensure higher transmittance and higher image quality, without color unevenness and light leakage, than in the in-plane switching mode liquid crystal display. It is another object of the present invention to provide an FFS mode liquid crystal display device.

Solution to Problem

According to the first aspect of the present invention, there is provided a color filter substrate for use in a fringe-field switching mode liquid crystal display wherein the color filter substrate and an array substrate provided with a comb-shaped pixel electrode having an electrode width of 10 μm or less are arranged facing each other with a liquid crystal layer interposed therebetween, the color filter substrate comprising: a transparent substrate; a black matrix provided on the transparent substrate, comprising an organic pigment as a main coloring agent; a red pixel, a green pixel and a blue pixel which are provided in regions partitioned by the black matrix on the transparent substrate and each have a relative dielectric constant of 2.9 or more but or less 4.4, as measured at a frequency at which the liquid crystal is driven; and a transparent resin layer provided on the red pixel, the green pixel and the blue pixel, wherein the relative dielectric constant of each of the color pixels falls within ±0.3 of an average relative dielectric constant of the red pixel, the green pixel and the blue pixel.

According to the second aspect of the present invention, there is provided a liquid crystal display comprising the above-defined color filter substrate.

According to the third aspect of the present invention, there is provided a fringe-field switching mode liquid crystal display comprising a color filter substrate comprising a transparent substrate; a black matrix provided on the transparent substrate; a red pixel, a green pixel and a blue pixel which are provided in regions partitioned by the black matrix and each have a relative dielectric constant of 2.9 or more but 4.4 or less, as measured at a frequency at which the liquid crystal is driven, and a transparent resin layer provided on the red pixel, the green pixel and the blue pixel, wherein the relative dielectric constant of each of the color pixels falls within ±0.3 of an average relative dielectric constant of the red pixel, the green pixel and the blue pixel; an array substrate disposed facing the color filter substrate, and provided with a comb-shaped pixel electrode having an electrode width of 10 μm or less; and a liquid crystal layer interposed between the color filter substrate and the array substrate.

In this description, a color layer patternwise formed in a black matrix aperture is referred to as a color pixel, and specifically referred to as a red pixel, a green pixel or a blue pixel. The color layer on a frame portion outside an effective display region of liquid crystal is referred to as a red layer, a blue layer or the like. The film as a measurement sample for use in the measuring of relative dielectric constant is likewise referred to as a red layer, a green layer or a blue layer. The relative dielectric constant of a color pixel mentioned in this description refers to the data obtained by forming a color layer as a measurement sample and measuring the same.

BRIEF DESCRIPTION OF THE SEVERAL VIEWS OF THE DRAWING

FIG. 4 shows a schematic cross section of a color filter substrate according to Example 2 of the present invention.

DETAILED DESCRIPTION OF THE INVENTION

Figure 1:
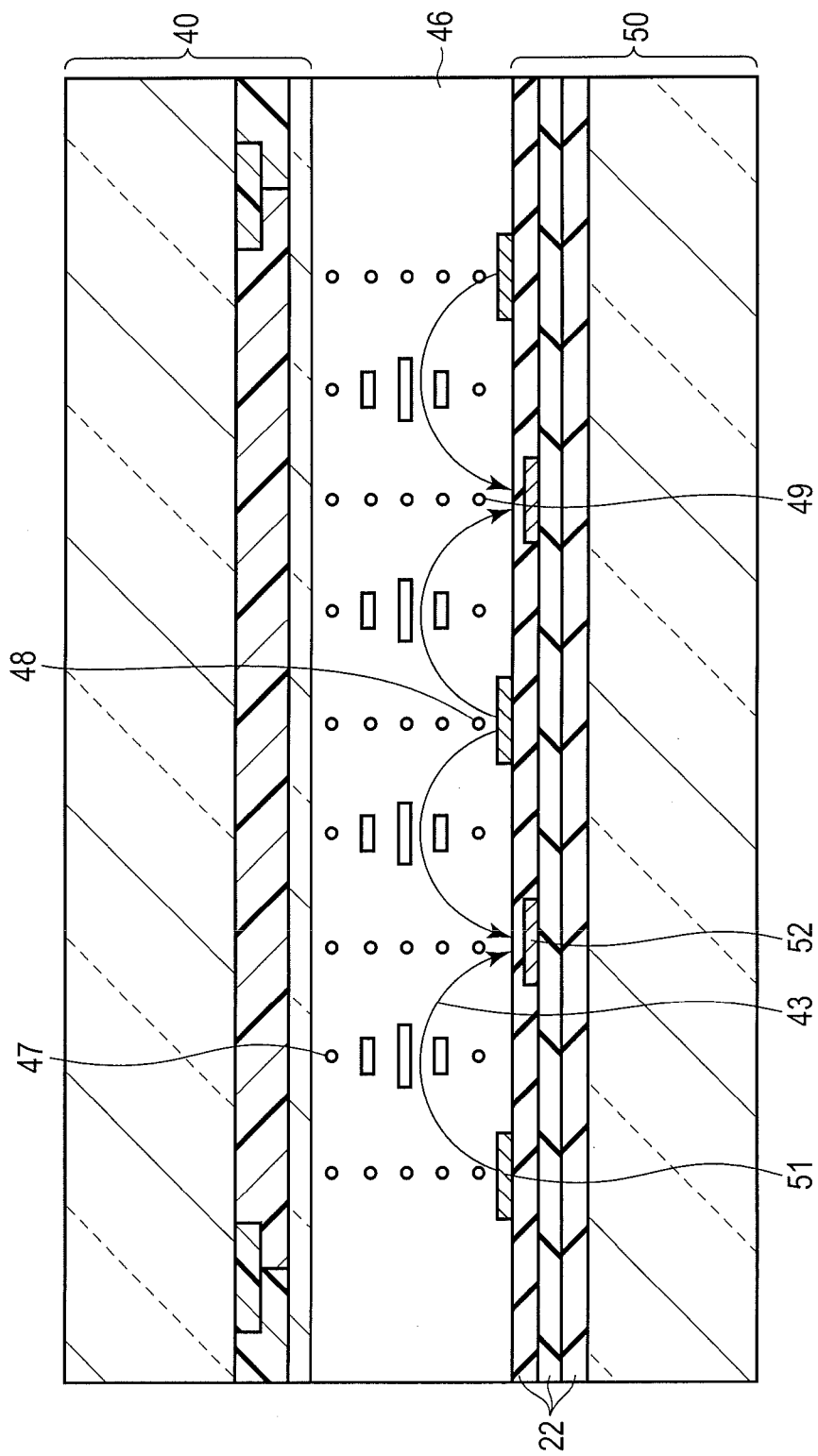
FIG. 1 shows a schematic cross section of the conventional in-plane switching mode liquid crystal display.
Figure 2:
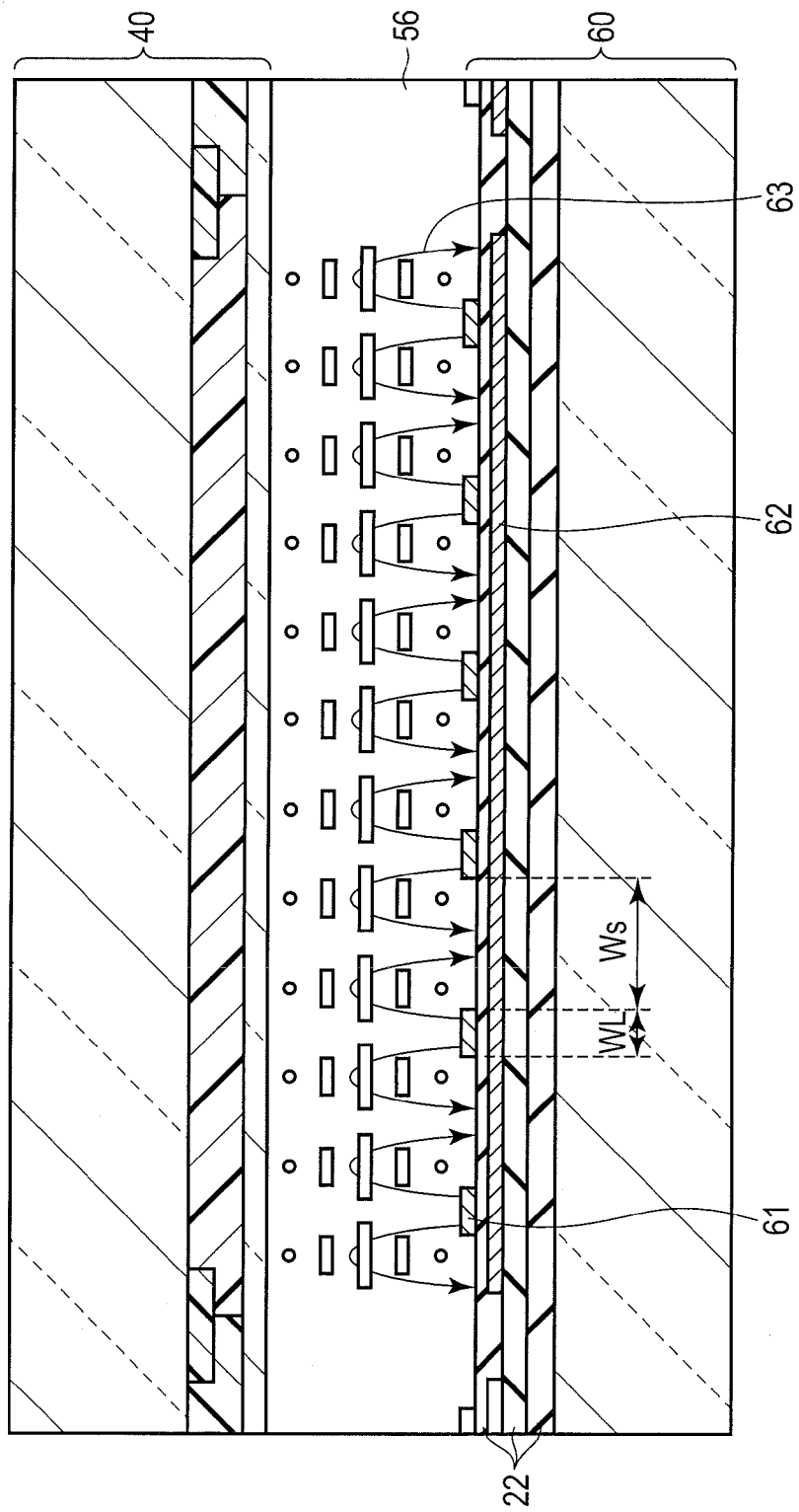
FIG. 2 shows a schematic cross section of the conventional fringe-field switching mode liquid crystal display.

Embodiments of the present invention will be described below.

The color filter substrate according to an aspect of the present invention is one for use in a fringe-field switching mode liquid crystal display. The fringe-field switching mode liquid crystal display is so structured that the color filter substrate and an array substrate provided with a comb-shaped pixel electrode having an electrode width of 10 μm or less are arranged facing each other with a liquid crystal layer interposed therebetween. In the event that the electrode width of the comb-shaped pixel electrode exceeds 10 μm, the transmittance exhibited when the normally black fringe-field switching mode liquid crystal display is in on-states (at the time of application of a liquid-crystal-driving-voltage to the comb-shaped pixel electrode) becomes unfavorably low. The smaller the electrode width (WL) and inter-electrode distance (Ws) of the comb-shaped pixel electrode are, the higher the transmittance is. However, when the electrode width of the comb-shaped pixel electrode is 1 μm or less, the accuracy of pattern reproduction in photolithographic process becomes poor, thereby causing a yield drop. It is preferred for the electrode width (WL) and inter-electrode distance (Ws) of the comb-shaped pixel electrode to fall within the range of 2 μm or more but 5 μm or less.

This color filter substrate comprises a transparent substrate; a black matrix provided on the transparent substrate, comprising an organic pigment as a main coloring agent; a red pixel, a green pixel and a blue pixel which are provided in regions partitioned by the black matrix on the transparent substrate and each have a relative dielectric constant of 2.9 or more but 4.4 or less, as measured at a frequency at which the liquid crystal is driven; and a transparent resin layer provided on the red pixel, the green pixel and the blue pixel. When the relative dielectric constant of each of the color pixels is below 2.9, a coloring agent, such as an organic pigment, cannot be added in an amount sufficient to ensure chromatic purity to the transparent resin, so that a color filter of favorable performance cannot be provided. When the relative dielectric constant of each of the color pixels exceeds 4.4, unfavorably, a response delay of liquid crystal and nonuniformity in gradation display occur.

The relative dielectric constant of each of the color pixels falls within ±0.3 of an average relative dielectric constant of the red pixel, the green pixel and the blue pixel (difference from the average: 0.3 or less). When the difference in relative dielectric constant falls outside this range, color unevenness occurs.

In this color filter substrate, the black matrix can have a relative dielectric constant of 2.9 or more but 4.4 or less, as measured at a frequency at which the liquid crystal is driven. Further, the black matrix can have a relative dielectric constant as measured at a frequency at which the liquid crystal is driven, which relative dielectric constant is smaller than a value of dielectric constant anisotropy exhibited by the liquid crystal used in the fringe-field switching mode. Still further, the coloring agent of the black matrix can comprise the organic pigment in an amount of 92 mass % or more based on the whole amount of the coloring agent, and can comprise carbon as a balance.

The green pixel can comprise a halogenated zinc phthalocyanine pigment as a main coloring agent.

The average relative dielectric constant of the red pixel, the green pixel and the blue pixel can be smaller than a value of dielectric constant anisotropy exhibited by the liquid crystal used in the fringe-field switching mode.

The frequency applied in the measuring of the relative dielectric constant can be a frequency ranging from 120 to 480 Hz.

The black matrix can have a pattern shape configured to partition four sides of each of the color pixels in a lattice form or two sides thereof in a stripe form and can have a frame pattern surrounding an effective display region of liquid crystal display, wherein, on the frame pattern, one of a blue layer used in forming the blue pixel and a red layer used in forming the red pixel can be superimposed, or two thereof can be superimposed one upon the other.

In particular, the black matrix can have a pattern shape configured to partition four sides of each of the color pixels in a lattice form or two sides thereof in a stripe form and can have a frame pattern surrounding an effective display region of liquid crystal display, wherein, on the frame pattern, a red layer used in forming the red pixel and a blue layer used in forming the blue pixel can be superimposed in this order one upon the other.

According to an aspect of the present invention, there can be provided a color filter substrate for FFS mode liquid crystal display that when incorporated in the liquid crystal display device, can avoid display defects, such as color unbalance and red or white color unevenness. Moreover, there can be provided a color filter substrate for FFS mode liquid crystal display that can avoid light leakage at a border of black matrix and color layer. In addition, there can be provided an FFS mode liquid crystal display freed of the above display defects.

Figure 3:
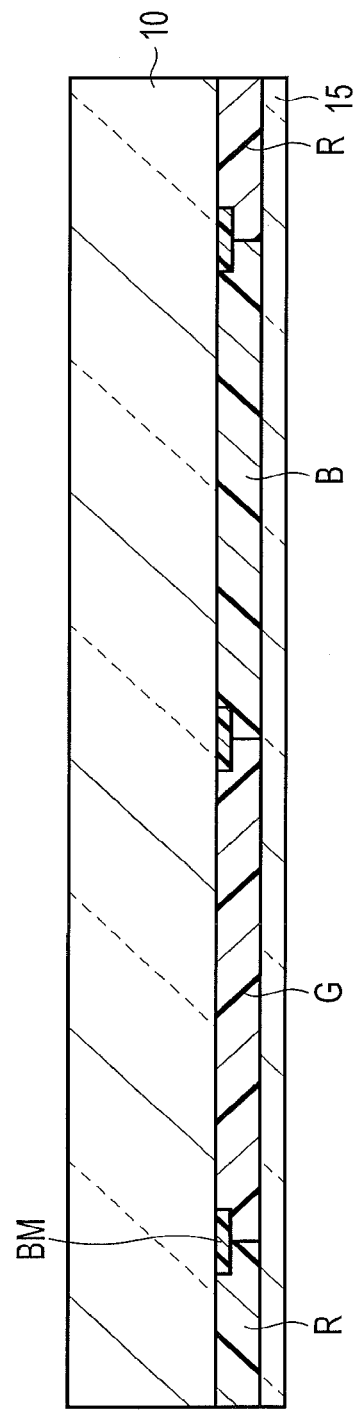
FIG. 3 shows a schematic cross section of a color filter substrate according to an embodiment of the present invention.

FIG. 3 shows a cross section of a color filter substrate according to an embodiment of the present invention. In FIG. 3, a black matrix (BM) comprising an organic pigment as a main coloring agent is provided on a transparent substrate (10) comprised of, for example, glass. A red pixel (R), a green pixel (G) and a blue pixel (B) are provided in regions on the transparent substrate (10) partitioned by the black matrix (BM). The red pixel (R), green pixel (G) and blue pixel (B) are covered by a transparent resin layer (15). Thus, a color filter substrate is constructed.

This color filter substrate is one for use in a fringe-field switching mode liquid crystal display, as mentioned above, wherein the color filter substrate and an array substrate provided with a comb-shaped pixel electrode having an electrode width of 10 μm or less are bonded to each other with a liquid crystal interposed therebetween.

The main object of application of this embodiment is a normally-black-display liquid crystal display device comprising a liquid crystal whose initial alignment is a horizontal alignment or perpendicular alignment, and this embodiment presupposes a liquid crystal display device comprising a color filter substrate and an array substrate provided with a liquid crystal driving element, such as TFT, that are bonded to each other with a liquid crystal layer interposed therebetween. As the liquid crystal, use can be made of both a liquid crystal exhibiting a positive dielectric constant anisotropy and a liquid crystal exhibiting a negative dielectric constant anisotropy. The liquid crystal exhibiting a positive dielectric constant anisotropy is advantageous in that the dielectric constant anisotropy (Δ∈) and birefringence (Δn) of liquid crystal can be selected from a wide variety of liquid crystal materials.

A feature of this embodiment is to uniformize the relative dielectric constants of color pixels in the color filter so as to avoid any display difference between pixels of different colors caused by the driving of employed liquid crystal. Another feature of this embodiment is to construct color pixels with a material of dielectric constant anisotropy smaller than the value of dielectric constant anisotropy of the liquid crystal so as to avoid any influence upon the driving of employed liquid crystal. In the FFS mode liquid crystal display device comprising a liquid crystal whose initial alignment is horizontal and whose dielectric constant anisotropy is positive, a plurality of advantages can be obtained by selecting Δ∈ from the range of somewhat large dielectric constant anisotropy, for example, 4.5 to 6.5 and applying the same to this embodiment. One of such advantages is to lower the threshold voltage associated with liquid crystal driving and to improve the response (rise) of liquid crystal. Selection of liquid crystal materials for use in the liquid crystal device comprising the color filter substrate according to this embodiment will be described in detail below.

As mentioned above, the color filter must comprise color pixels, the relative dielectric constant of each of which falls within ±0.3 of an average relative dielectric constant of the red pixel, the green pixel and the blue pixel, so as to avoid any color unevenness at the time of color display. As will be mentioned hereinafter, when the difference in relative dielectric constant between color pixels exceeds 0.8 or 1.0 in the FFS mode liquid crystal display device, color unevenness and light leakage are likely to occur at the time of liquid crystal display. As a result of study by the inventors, it has been found that, as will be described in detail in Examples hereinafter, the relative dielectric constants of color pixels, even if comprised of materials likely to have a high relative dielectric constant such as that of the black matrix, can be suppressed to 4.4 or below by selection of organic pigment as a coloring agent, pigment ratio and material selection for base material resin, dispersant, etc.

In the FFS mode liquid crystal display device comprising a liquid crystal exhibiting a positive dielectric constant anisotropy, the value of relative dielectric constant of each of color filter constituent materials can be made smaller than the value of dielectric constant anisotropy of the liquid crystal by selecting Δ∈ from the range of somewhat large dielectric constant anisotropy, for example, 4.5 to 6.5, so that conditions not detrimental to liquid crystal driving can be realized. Usually, a coloring composition containing a photosensitive acrylic resin is used in the formation of color pixels in the color filter. The relative dielectric constant of a transparent resin, such as an acrylic resin, is generally around 2.8. As a result of study by the inventors, it has been found that the lower limit of the relative dielectric constant of each color pixel being a dispersion system of organic pigment is 2.9.

(Measurement of Relative Dielectric Constant)

In the Examples to be described hereinafter, the relative dielectric constant of each color pixel was measured at frequencies of 120, 240 and 480 Hz in the condition of a voltage of 5 V by means of an impedance analyzer, model 1260, manufactured by Solartron Mobrey. The measurement sample was one obtained by applying a color layer on a glass substrate having been patternwise provided with a conductive film comprised of an aluminum thin film, hardening the color layer (thickness: the same as in the Examples to be described hereinafter) and superimposing a conductive film pattern comprised of an aluminum thin film on the color layer.

(Measurement of OD of Black Matrix)

The optical density (OD value) as an index for light blocking property was measured by means of a Gretag Macbeth D-200II.

(Measurement of Chromaticity)

The chromaticity coordinate of each color layer was measured by means of a microscopic spectrophotometer OSP-2000 (manufactured by Olympus Optical Co., Ltd.).

Examples of the transparent resins, organic pigments, etc., that can be used in the color filter substrate according to the foregoing embodiment will be described below.

(Transparent Resin)

The photosensitive color composition for use in the formation of a light shielding layer and a color pixel comprises a pigment dispersion and further a polyfunctional monomer, a photosensitive resin, a nonphotosensitive resin, a polymerization initiator, a solvent, etc. Highly transparent organic resins that can be used in this embodiment, including a photosensitive resin and a nonphotosensitive resin, are collectively referred to as a transparent resin. The following resins can be used as the transparent resin.

In particular, a thermoplastic resin, a thermosetting resin and a photosensitive resin can be used as the transparent resins. As the thermoplastic resin, there can be mentioned, for example, a butyral resin, a styrene-maleic acid copolymer, a chlorinated polyethylene, a chlorinated polypropylene, polyvinyl chloride, a vinyl chloride-vinyl acetate copolymer, polyvinyl acetate, a polyurethane resin, a polyester resin, an acrylic resin, an alkyd resin, a polystyrene resin, a polyamide resin, a rubber resin, a cyclized rubber resin, a cellulose, polybutadiene, polyethylene, polypropylene, a polyimide resin or the like. As the thermosetting resin, there can be mentioned, for example, an epoxy resin, a benzoguanamine resin, a rosin-modified maleic acid resin, a rosin-modified fumaric acid resin, a melamine resin, a urea resin, a phenolic resin or the like. As the thermosetting resin, use can be made of a resin resulting from reaction between a melamine resin and a compound containing an isocyanate group.

(Alkali-Soluble Resin)

In the formation of a black matrix (light blocking layer) as a material for black matrix formation, color pixels and a transparent resin layer as an overcoat for use in this embodiment, it is preferred to use a photosensitive resin composition that permits patterning by photolithography. It is preferred for the transparent resin to be a resin imparted with alkali solubility. The alkali-soluble resin is not particularly limited as long as it is a resin containing a carboxyl group or a hydroxyl group. For example, there can be mentioned an epoxy acrylate resin, a novolac resin, a polyvinylphenol resin, an acrylic resin, a carboxylated epoxy resin, a carboxylated urethane resin or the like. Of these, an epoxy acrylate resin, a novolac resin and an acrylic resin are preferred. An epoxy acrylate resin and a novolac resin are especially preferred.

(Acrylic Resin)

As representative examples of the transparent resins that can be employed in this embodiment, there can be mentioned the following acrylic resins.

In particular, the acrylic resins can be polymers prepared from, as monomers, (meth)acrylic acid; an alkyl(meth)acrylate, such as methyl(meth)acrylate, ethyl(meth)acrylate, propyl(meth)acrylate, butyl(meth)acrylate, t-butyl(meth)acrylate, pentyl(meth)acrylate or lauryl(meth)acrylate; a hydroxylated(meth)acrylate, such as hydroxyethyl(meth)acrylate or hydroxypropyl(meth)acrylate; an etherified (meth)acrylate, such as ethoxyethyl(meth)acrylate or glycidyl(meth)acrylate; an alicyclic(meth)acrylate, such as cyclohexyl(meth)acrylate, isobornyl(meth)acrylate or dicyclopentenyl(meth)acrylate; etc.

One of these monomers may be used alone, or two or more thereof may be used in combination. Further, the acrylic resins may be copolymers resulting from reaction between these monomers and compounds copolymerizable therewith, such as styrene, cyclohexylmaleimide and phenylmaleimide.

Moreover, photosensitive resins can be obtained by, for example, performing copolymerization of a carboxylic acid containing an ethylenically unsaturated group, such as (meth)acrylic acid, and thereafter reacting the resultant copolymer with a compound containing an epoxy group and an unsaturated double bond, such as glycidyl methacrylate, or by performing addition reaction of a carboxylated compound, such as (meth)acrylic acid, to a polymer of epoxidized (meth)acrylate, such as glycidyl methacrylate, or a copolymer resulting from reaction between the same and another (meth) acrylate.

Still further, photosensitive resins can be obtained by reacting a hydroxylated polymer obtained from a monomer, such as hydroxyethyl methacrylate, with a compound containing an isocyanate group and an ethylenically unsaturated group, such as methacryloyloxyethyl isocyanate.

Still further, as aforementioned, a carboxylated resin can be obtained by reacting a copolymer obtained from a monomer containing a plurality of hydroxyl groups, such as hydroxyethyl methacrylate, with a polyprotic acid anhydride to thereby introduce a carboxyl group in the copolymer. The process for producing a carboxylated resin is not limited to this method.

As the acid anhydride for use in the above reaction, there can be mentioned, for example, malonic anhydride, succinic anhydride, maleic anhydride, itaconic anhydride, phthalic anhydride, tetrahydrophthalic anhydride, hexahydrophthalic anhydride, methyltetrahydrophthalic anhydride, trimellitic anhydride or the like.

It is preferred for the acid number of the solid contents of the above-mentioned acrylic resins to be in the range of 20 to 180 mg KOH/g. When the acid number is smaller than 20 mg KOH/g, the speed of the development of the photosensitive resin composition tends to be extremely low to thereby increase the development time and hence result in poor productivity. On the other hand, when the acid number of the solid contents is larger than 180 mg KOH/g, the development speed tends to be extremely high to thereby cause development failures, such as pattern exfoliation and pattern chipping.

Further, when the acrylic resin exhibits photosensitivity, it is preferred for the double bond equivalent weight of the acrylic resin to be 100 or greater. The double bond equivalent weight is more preferably in the range of 100 to 2000, most preferably 100 to 1000. When the double bond equivalent weight exceeds 2000, satisfactory photohardenability may not be obtained.

(Photopolymerizable Monomer)

Examples of photopolymerizable monomers include various acrylic and methacrylic esters, such as 2-hydroxyethyl (meth)acrylate, 2-hydroxypropyl(meth)acrylate, cyclohexyl (meth)acrylate, polyethylene glycol di(meth)acrylate, pentaerythritol tri(meth)acrylate, trimethylolpropane tri (meth)acrylate, dipentaerythritol hexa(meth)acrylate, tricyclodecanyl(meth)acrylate, melamine(meth)acrylate and epoxy(meth)acrylate, and further include (meth)acrylic acid, styrene, vinyl acetate, (meth)acrylamide, N-hydroxymethyl (meth)acrylamide, acrylonitrile and the like.

It is also preferred to use a polyfunctional urethane acrylate containing a (meth)acryloyl group, obtained by reacting a hydroxylated(meth)acrylate with a polyisocyanate. Combinations of hydroxylated(meth)acrylate and polyisocyanate are arbitrary and are not particularly limited. One type of polyfunctional urethane acrylate may be used alone, or two or more types thereof may be used in combination.

(Photopolymerization Initiator)

Examples of photopolymerization initiators include an acetophenone compound, such as 4-phenoxydichloroacetophenone, 4-t-butyl-dichloroacetophenone, diethoxyacetophenone, 1-(4-isopropylphenyl)-2-hydroxy-2-methylpropan-1-one, 1-hydroxycyclohexyl phenyl ketone or 2-benzyl-2-dimethylamino-1-(4-morpholinophenyl)-butan-1-one; a benzoin compound, such as benzoin, benzoin methyl ether, benzoin ethyl ether, benzoin isopropyl ether or benzyldimethyl ketal; a benzophenone compound, such as benzophenone, benzoylbenzoic acid, methyl benzoylbenzoate, 4-phenylbenzophenone, hydroxybenzophenone, acrylated benzophenone or 4-benzoyl-4'-methyldiphenyl sulfide; a thioxanthone compound, such as thioxanthone, 2-chlorothioxanthone, 2-methylthioxanthone, isopropylthioxanthone or 2,4-diisopropylthioxanthone; a triazine compound, such as 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-pipenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1- yl)-4,6-bis(trichloromethyl)-s-triazine, 2,4-trichloromethyl-(piperonyl)-6-triazine or 2,4-trichloromethyl(4'-methoxystyryl)-6-triazine; an oxime ester compound, such as 1,2-octanedione, 1-[4-(phenylthio)-2-(O-benzoyloxime)] or O-(acetyl)-N-(1-phenyl-2-oxo-2-(4'-methoxynaphthyl)ethylidene)hydroxylamine; a phosphine compound, such as bis(2,4,6-trimethylbenzoyl)phenylphosphine oxide or 2,4,6-trimethylbenzoyldiphenylphosphine oxide; a quinone compound, such as 9,10-phenanthrenequinone, camphorquinone or ethylanthraquinone; a borate compound; a carbazole compound; an imidazole compound; a titanocene compound; and the like. Oxime derivatives (oxime compounds) are effective for sensitivity enhancement. One of these initiators can be used alone, or two or more thereof can be used in combination.

(Sensitizer)

It is preferred to use a photopolymerization initiator in combination with a sensitizer. Compounds, such as n-acyloxy esters, acylphosphine oxides, methyl phenyl glyoxylate, benzyl-9,10-phenanthrenequinone, camphorquinine, ethylanthraquinone, 4,4'-diethylisophthalophenone, 3,3',4,4'-tetra(t-butylperoxycarbonyl)benzophenone and 4,4'-diethylaminobenzophenone, can be used as sensitizers.

Any of these sensitizers can be incorporated in an amount ranging from 0.1 to 60 parts by mass per 100 parts by mass of photopolymerization initiator.

(Ethylenically Unsaturated Compound)

It is preferred to use the above-mentioned photopolymerization initiator in combination with an ethylenically unsaturated compound. The term "ethylenically unsaturated compound" means a compound containing at least one ethylenically unsaturated bond in each molecule thereof. In particular, a compound containing two or more ethylenically unsaturated bonds in each molecule is preferred from the viewpoint of polymerizability, crosslinkability, an increase of any difference in developer solubility between exposed areas and nonexposed areas in accordance therewith, etc. A (meth)acrylate compound containing an unsaturated bond originating from a (meth)acryloyloxy group is particularly preferred.

As the compound containing at least one ethylenically unsaturated bond in each molecule thereof, there can be mentioned, for example, an unsaturated carboxylic acid, such as (meth)acrylic acid, crotonic acid, isocrotonic acid, maleic acid, itaconic acid or citraconic acid, or an alkyl ester thereof; (meth)acrylonitrile; (meth)acrylamide; styrene; or the like. Representative examples of the compounds each containing two or more ethylenically unsaturated bonds in each molecule thereof include an ester from unsaturated carboxylic acid and polyhydroxy compound, a (meth)acryloyloxy-containing phosphate, a urethane(meth)acrylate from hydroxy (meth)acrylate compound and polyisocyanate compound, an epoxy(meth)acrylate from (meth)acrylic acid or hydroxy (meth)acrylate compound and polyepoxy compound, and the like.

The above-described photopolymerization initiator, sensitizer and ethylenically unsaturated compound may be added to a composition containing a polymerizable liquid crystal compound in the event that the color filter substrate according to the present invention is provided with a retardation layer.

(Polyfunctional Thiol)

The photosensitive color composition can be loaded with a polyfunctional thiol capable of acting as a chain-transfer agent. The polyfunctional thiol is not limited as long as the compound contains two or more thiol groups. For example, there can be mentioned hexanedithiol, decanedithiol, 1,4-butanediol bisthiopropionate, 1,4-butanediol bisthioglycolate, ethylene glycol bisthioglycolate, ethylene glycol bisthiopropionate, trimethylolpropane tristhioglycolate, trimethylolpropane tristhiopropionate, trimethylolpropane tris(3-mercaptobutyrate), pentaerythritol tetrakisthioglycolate, pentaerythritol tetrakisthiopropionate, tris(2-hydroxyethyl) trimercaptopropionate isocyanurate, 1,4-dimethylmercaptobenzene, 2,4,6-trimercapto-s-triazine, 2-(N,N-dibutylamino)-4,6-dimercapto-s-triazine, or the like.

One of these polyfunctional thiols can be used alone, or two or more thereof can be used in the form of a mixture. The polyfunctional thiol can preferably be used in an amount of 0.2 to 150 parts by mass, more preferably 0.2 to 100 parts by mass, per 100 parts by mass of pigment in the photosensitive color composition.

(Storage Stabilizer)

The photosensitive color composition can be loaded with a storage stabilizer in order to stabilize the viscosity of the composition over time. As the storage stabilizer, there can be mentioned, for example, a quaternary ammonium chloride, such as one from benzyltrimethyl chloride and diethylhydroxyamine; an organic acid, such as lactic acid or oxalic acid, or a methyl ether thereof; t-butyl-pyrocatechol; an organic phosphine, such as triethylphosphine or triphenylphosphine; a phosphite; or the like. The storage stabilizer can be incorporated in an amount of 0.1 to 10 parts by mass per 100 parts by mass of pigment in the photosensitive color composition.

(Adherence Improver)

The photosensitive color composition can further be loaded with an adherence improver, such as a silane coupling agent, in order to enhance the adherence thereof to the substrate. As the silane coupling agent, there can be mentioned a vinylsilane, such as vinyltris(β-methoxyethoxy)silane, vinylethoxysilane or vinyltrimethoxysilane; a (meth)acrylsilane, such as γ-methacryloxypropyltrimethoxysilane; an epoxysilane, such as β-(3,4-epoxycyclohexyl)ethyltrimethoxysilane, β-(3,4-epoxycyclohexyl)methyltrimethoxysilane, β-(3,4-epoxycyclohexyl)ethyltriethoxysilane, β-(3,4-epoxycyclohexyl)methyltriethoxysilane, γ-glycidoxypropyltrimethoxysilane or γ-glycidoxypropyltriethoxy silane; an aminosilane, such as N-β(aminoethyl)-γ-aminopropyltrimethoxysilane, N-β(aminoethyl)-γ-aminopropyl triethoxysilane, N-β(aminoethyl)-γ-aminopropylmethyldiethoxysilane, γ-aminopropyltriethoxysilane, γ-aminopropyltrimethoxysilane, N-phenyl-γ-aminopropyltrimethoxysilane or N-phenyl-γ-aminopropyltriethoxysilane; a thiosilane, such as γ-mercaptopropyltrimethoxysilane or γ-mercaptopropyltriethoxysilane; or the like. The silane coupling agent can be incorporated in an amount of 0.01 to 100 parts by mass per 100 parts by mass of pigment in the photosensitive color composition.

(Solvent)

The photosensitive color composition is loaded with a solvent, such as water or an organic solvent, so that the surface of the substrate can be uniformly coated therewith. When the composition for use in this embodiment is used in a color layer of color filter, the solvent also has the function of uniformly dispersing the pigment. Examples of the solvents include cyclohexanone, ethyl Cellosolve acetate, butyl Cellosolve acetate, 1-methoxy-2-propyl acetate, diethyleneglycol dimethyl ether, ethylbenzene, ethylene glycol diethyl ether, xylene, ethyl Cellosolve, methyl-n-amyl ketone, propylene glycol monomethyl ether, toluene, methyl ethyl ketone, ethyl acetate, methanol, ethanol, isopropyl alcohol, butanol, isobutyl ketone, a petroleum solvent, and the like. One of these solvents may be used alone, or two or more thereof may be used in the form of a mixture. The solvent can be incorporated in an amount of 800 to 4000 parts by mass, preferably 1000 to 2500 parts by mass, per 100 parts by mass of pigment in the color composition.

(Organic Pigment)

As red pigment, for example, C. I. Pigment Red 7, 9, 14, 41, 48:1, 48:2, 48:3, 48:4, 81:1, 81:2, 81:3, 97, 122, 123, 146, 149, 168, 177, 178, 179, 180, 184, 185, 187, 192, 200, 202, 208, 210, 215, 216, 217, 220, 223, 224, 226, 227, 228, 240, 242, 246, 254, 255, 264, 272, or 279, or the like may be used.

Yellow pigment, for example, includes C. I. Pigment Yellow 1, 2, 3, 4, 5, 6, 10, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 144, 146, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like.

As blue pigment, for example, C. I. Pigment Blue 15, 15:1, 15:2, 15:3, 15:4, 15:6, 16, 22, 60, 64, 80, or the like may be used. Among these, C. I. Pigment Blue 15:6 is preferred.

As violet pigment, for example, C. I. Pigment Violet 1, 19, 23, 27, 29, 30, 32, 37, 40, 42, 50, or the like may be used. Among these, C. I. Pigment Violet 23 is preferred.

As green pigment, for example, C. I. Pigment Green 1, 2, 4, 7, 8, 10, 13, 14, 15, 17, 18, 19, 26, 36, 45, 48, 50, 51, 54, 55, 58, or the like may be used. In particular, it is preferred to use C. I. Pigment Green 58 as the main coloring agent.

Hereinafter, when the coloring agent species of the C. I. Pigment is indicated, the abbreviations, such as PB (Pigment Blue), PV (Pigment Violet), PR (Pigment Red), PY (Pigment Yellow), and PG (Pigment Green), may be simply used.

(Dye)

The color composition for use in the color filter according to this embodiment can be loaded with a dye aside from the above-mentioned pigment.

As the dye, there can be mentioned an acid dye, an oil-soluble dye, a disperse dye, a reactive dye, a direct dye or the like. Examples of the dyes include an azo dye, a benzoquinone dye, a naphthoquinone dye, an anthraquinone dye, a cyanine dye, a scuarylium dye, a croconium dye, a merocyanine dye, a stilbene dye, a diarylmethane dye, a triarylmethane dye, a fluoran dye, a spiropyran dye, a phthalocyanine dye, an indigo dye, a fulgide dye, a nickel complex dye and an azulene dye.

The specific dye includes those having the following color index numbers: C. I. Solvent Yellow 2, 3, 7, 12, 13, 14, 16, 18, 19, 21, 25, 25:1, 27, 28, 29, 30, 33, 34, 36, 42, 43, 44, 47, 56, 62, 72, 73, 77, 79, 81, 82, 83, 83:1, 88, 89, 90, 93, 94, 96, 98, 104, 107, 114, 116, 117, 124, 130, 131, 133, 135, 141, 143, 145, 146, 157, 160:1, 161, 162, 163, 167, 169, 172, 174, 175, 176, 179, 180, 181, 182, 183, 184, 185, 186, 187, 189, 190, 191, C. I. Solvent Orange 1, 2, 3, 4, 5, 7, 11, 14, 20, 23, 25, 31, 40:1, 41, 45, 54, 56, 58, 60, 62, 63, 70, 75, 77, 80, 81, 86, 99, 102, 103, 105, 106, 107, 108, 109, 110, 111, 112, 113, C. I. Solvent Red 1, 2, 3, 4, 8, 16, 17, 18, 19, 23, 24, 25, 26, 27, 30, 33, 35, 41, 43, 45, 48, 49, 52, 68, 69, 72, 73, 83:1, 84:1, 89, 90, 90:1, 91, 92, 106, 109, 110, 118, 119, 122, 124, 125, 127, 130, 132, 135, 141, 143, 145, 146, 149, 150, 151, 155, 160, 161, 164, 164:1, 165, 166, 168, 169, 172, 175, 179, 180, 181, 182, 195, 196, 197, 198, 207, 208, 210, 212, 214, 215, 218, 222, 223, 225, 227, 229, 230, 233, 234, 235, 236, 238, 239, 240, 241, 242, 243, 244, 245, 247, 248, C. I. Solvent Violet 2, 8, 9, 11, 13, 14, 21, 21:1, 26, 31, 36, 37, 38, 45, 46, 47, 48, 49, 50, 51, 55, 56, 57, 58, 59, 60, 61, C. I. Solvent Blue 2, 3, 4, 5, 7, 18, 25, 26, 35, 36, 37, 38, 43, 44, 45, 48, 51, 58, 59, 59:1, 63, 64, 67, 68, 69, 70, 78, 79, 83, 94, 97, 98, 100, 101, 102, 104, 105, 111, 112, 122, 124, 128, 129, 132, 136, 137, 138, 139, 143, C. I. Solvent Green 1, 3, 4, 5, 7, 28, 29, 32, 33, 34, 35, C. I. Solvent Brown 1, 3, 4, 5, 12, 20, 22, 28, 38, 41, 42, 43, 44, 52, 53, 59, 60, 61, 62, 63, C. I. Solvent Black 3, 5, 5:2, 7, 13, 22, 22:1, 26, 27, 28, 29, 34, 35, 43, 45, 46, 48, 49, 50, C. I. Acid Red 6, 11, 26, 60, 88, 111, 186, 215, C. I. Acid Green 25, 27, C. I. Acid Blue 22, 25, 40, 78, 92, 113, 129, 167, 230, C. I. Acid Yellow 17, 23, 25, 36, 38, 42, 44, 72, 78, C. I. Basic Red 1, 2, 13, 14, 22, 27, 29, 39, C. I. Basic Green 3, 4, C. I. Basic Blue 3, 7, 9, 11, 17, 41, 66, C. I. Basic Violet 1, 3, 18, 39, 66, C. I. Basic Yellow 11, 23, 25, 28, 41, C. I. Direct Red 4, 23, 31, 75, 76, 79, 80, 81, 83, 84, 149, 224, C. I. Direct Green 26, 28, C. I. Direct Blue 71, 78, 98, 106, 108, 192, 201, C. I. Direct Violet 51, C. I. Direct Yellow 26, 27, 28, 33, 44, 50, 86, 142, C. I. Direct Orange 26, 29, 34, 37, 72, C. I. Sulphur Red 5, 6, 7, C. I. Sulphur Green 2, 3, 6, C. I. Sulphur Blue 2, 3, 7, 9, 13, 15, C. I. Sulphur Violet 2, 3, 4, C. I. Sulphur Yellow 4, C. I. Vat Red 13, 21, 23, 28, 29, 48, C. I. Vat Green 3, 5, 8, C. I. Vat Blue 6, 14, 26, 30, C. I. Vat Violet 1, 3, 9, 13, 15, 16, C. I. Vat Yellow 2, 12, 20, 33, C. I. Vat Orange 2, 5, 11, 15, 18, 20, C. I. Azoic Coupling Component 2, 3, 4, 5, 7, 8, 9, 10, 11, 13, 32, 37, 41, 48, C. I. Reactive Red 8, 22, 46, 120, C. I. Reactive Blue 1, 2, 7, 19, C. I. Reactive Violet 2, 4, C. I. Reactive Yellow 1, 2, 4, 14, 16, C. I. Reactive Orange 1, 4, 7, 13, 16, 20, C. I. Disperse Red 4, 11, 54, 55, 58, 65, 73, 127, 129, 141, 196, 210, 229, 354, 356, C. I. Disperse Blue 3, 24, 79, 82, 87, 106, 125, 165, 183, C. I. Disperse Violet 1, 6, 12, 26, 27, 28, C. I. Disperse Yellow 3, 4, 5, 7, 23, 33, 42, 60, 64, C. I. Disperse Orange 13, 29, 30.

In order to exhibit a desired optical spectrum, one of these dyes can be used alone, or two or more thereof may be used in combination.

Among the dyes, cationic dyes are preferred. Counteranions of the cationic dyes can be altered by conventional methods. It is preferred for the anions employed in the alteration to be anions of so-called superstrong acids from the viewpoint of high thermal stability and lightfastness. As examples of the cationic dyes, there can be mentioned those of the following color index numbers.

Those are: C. I. Basic Red 1, 2, 12, 13, 14, 16, 18:1, 21, 22, 26, 27, 28, 29, 36, 46, 54, 56, 58, 78, C. I. Basic Yellow 1, 11, 12, 13, 14, 15, 24, 28, 29, 30, 37, 40, 41, 45, 46, 51, 57, 62, 67, C. I. Disperse Red 50, 90, 117, 118, 177, 122, 126, 128, 145, 146, 157, C. I. Disperse Yellow 5, 8, 22, 27, 50, 56, 74, 84, 88, 114, 119, 160, 164, 182, 184, 187, 203, 227, 221, C. I. Basic Green 4, 5, 8, 10, C. I. Disperse Green 7, C. I. Basic Blue, 1, 3, 4, 7, 8, 9, 11, 12, 15, 18:1, 22, 41, 42, 45, 53, 54, 54:1, 55, 57, 60, 62, 66, 71, 75, 77, 92, 105, 113, 141, 147, 148, 162, C. I. Disperse Blue 7, 9, 10, 20, 35, 55, 56, 58, 62, 63, 65, 82, 85, 86, 87, 89, 91, 95, 102, 104, 106, 118, 124, 142, 143, 148, 162, 166, 179, 181, C. I. Violet 1, 3, 4, 5, 6, 7, 10, 14, 15, 16, 20, 22, 27, 28, 35, 37, 39, 53, 62, 63, 83, and the like. Further preferred are C. I. Basic Red 1, 2, 13, 14, 22, 27, 29, 39, C. I. Basic Green 3, 4, C. I. Basic Blue 3, 7, 9, 11, 17, 41, 66, C. I. Basic Violet 1, 3, 18, 39, 66, C. I. Basic Yellow 11, 23, 25, 28, 41, and the like.

(Coloring Agent of Light-Blocking Layer)

The light-blocking coloring agent contained in a light-blocking layer or black matrix is one having an absorbing capability in visible wavelength regions to thereby exhibit a light-blocking function. In this embodiment, as the light-blocking coloring agent, there can be mentioned, for example, an organic pigment, an inorganic pigment, a dye or the like. The inorganic pigment is, for example, carbon black, titanium oxide or the like. The dye is, for example, an azo dye, an anthraquinone dye, a phthalocyanine dye, a quinoneimine dye, a quinoline dye, a nitro dye, a carbonyl dye, a methine dye or the like. As the organic pigment, use can be made of those set forth above. One of these light-blocking components may be used alone, or two or more thereof may be used in arbitrary combination and ratio. The volume resistance of this coloring agent may be increased by providing the surface of the coloring agent with a resin coating. Contrarily, the volume resistance may be decreased by increasing the content of coloring agent relative to the base material of the resin to thereby impart some conductive property. However, the volume resistance of this light-blocking material falls within the range of about $1 \times 10^8$ to $1 \times 10^{15}$ Ω·cm, so that the value is not on a level affecting the value of resistance of the transparent conductive film. Similarly, the relative dielectric constant of the light-blocking layer can be regulated so as to fall within the range of about 3 to 20 by selection of a coloring agent and content ratio thereof. The relative dielectric constants of the light-blocking layer, first transparent resin layer and color layer can be regulated in accordance with design conditions for the liquid crystal display device and driving conditions for the liquid crystal. In the present invention, use can be made of a black matrix for FFS mode liquid crystal display device in which while the addition amount of carbon tending to exhibit an increased relative dielectric constant is decreased, the content of organic pigment is increased.

(Dispersant, Dispersion Aid)

It is preferred to employ a polymer dispersant as a pigment dispersant from the viewpoint that an excellent dispersion stability over time can be realized. As the polymer dispersant, there can be mentioned, for example, a urethane based dispersant, a polyethyleneimine based dispersant, a polyoxyethylene alkyl ether based dispersant, a polyoxyethylene glycol diester based dispersant, a sorbitan aliphatic ester based dispersant, an aliphatic modified polyester based dispersant or the like. Among these dispersants, a dispersant comprised of a graft copolymer containing a nitrogen atom is particularly preferred in the light-blocking photosensitive resin composition containing a large amount of pigment used in this embodiment from the viewpoint of favorable developability.

Specific examples of these dispersants include, in trade names, EFKA (produced by EFKA Additives B.V.), Disperbyk (produced by BYK Chemie), DISPERON (produced by Kusumoto Chemicals, Ltd.), SOLSPERSE (produced by The Lubrizol Corporation), KP (produced by Shin-Etsu Chemical Co., Ltd.), POLYFLOW (produced by Kyoeisha Chemical Co., Ltd.), etc. One of these dispersants may be used alone, or two or more thereof may be used in arbitrary combination and ratio.

As the dispersion aid, use can be made of, for example, any of pigment derivatives and the like. Examples of the pigment derivatives include azo, phthalocyanine, quinacridone, benzimidazolone, quinophthalone, isoindolinone, dioxazine, anthraquinone, indanthrene, perylene, perynone, diketopyroropyrrole and dioxazine derivatives. Among these, quinophthalone derivatives are preferred.

Substituents in these pigment derivatives are, for example, a sulfonate group, a sulfonamido group or quaternary salt thereof, a phthalimidomethyl group, a dialkylaminoalkyl group, a hydroxyl group, a carboxyl group and an amide group, which substituents may be bonded to a pigment skeleton directly or through an alkyl group, an aryl group, a heterocyclic group or the like. Among these substituents, a sulfonate group is preferred. These substituents may be introduced in a pigment skeleton.

As specific examples of the pigment derivatives, there can be mentioned a sulfonate derivative of phthalocyanine, a sulfonate derivative of quinophthalone, a sulfonate derivative of anthraquinone, a sulfonate derivative of quinacridone, a sulfonate derivative of diketopyroropyrrole, a sulfonate derivative of dioxazine and the like.

One of these dispersion aids and pigment derivatives may be used alone, or two or more thereof may be used in arbitrary combination and ratio.

<Process for Fabricating Color Filter>

In the color filter according to this embodiment, a red pixel, a green pixel and a blue pixel can be formed by applying the above color compositions onto a transparent substrate by use of a printing method, an inkjet method, a photolithography method or the like.

The formation of varied-color filter segments by use of a printing method excels in cost reduction and mass productivity as a process for producing a color filter because patterning can be performed by simply repeating the printing and drying of the above varied color compositions prepared as printing inks. Further, due to the advance of printing techniques, it is now feasible to print a very fine pattern with high dimensional precision and smoothness. In printing, the ink is preferably comprised of a composition formulated so that drying or solidification thereof does not occur on the surface of a printing plate or blanket. Moreover, it is also important to control the fluidity of the ink on a printing machine. The viscosity of the ink can be regulated by selecting a dispersant and/or an extender pigment.

The inkjet method is a method in which by means of an inkjet apparatus including a plurality of minute injection ports (inkjet heads) provided for individual colors, direct printing formation is performed on a transparent substrate or a substrate provided with an active element, such as a TFT.

When each of color pixels is formed by photolithography process, the above color composition formulated as a solvent-developable or alkali-developable color resist is applied onto the surface of a transparent substrate by any of coating methods, such as spray coating, spin coating, slit coating or roll coating, so that the thickness of a film upon drying ranges from 0.2 to 10 μm. At the drying of the coated film, use may be made of a vacuum dryer, a convection oven, an IR oven, a hot plate or the like. According to necessity, the dried film is exposed to ultraviolet rays through a mask with a given pattern provided in or out of contact with the film. Subsequently, the resultant film is either immersed in a solvent or an alkali developer, or sprayed with a developer by means of a sprayer, so as to remove any unhardened portion, thereby attaining desired patterning. Thereafter, the same procedure is repeated for other colors. Thus, a color filter can be obtained. For accelerating the polymerization of the color resists, heating may be applied thereto according to necessity. This photolithography process makes it feasible to manufacture a color filter with precision higher than in the use of the above printing method.

In the development, an aqueous solution of sodium carbonate, sodium hydroxide, etc., is used as an alkali developer. Use also can be made of an organic alkali, such as dimethylbenzylamine, triethanolamine or the like. Further, the developer may be loaded with a defoaming agent or a surfactant. As the development processing method, use can be made of a shower developing method, a spray developing method, a dip (immersion) developing method, a puddle (liquid accumulation) developing method, or the like.

In order to enhance the sensitivity to ultraviolet exposure, ultraviolet exposure can be performed after a procedure comprising coating the color resist having undergone application and drying with a water-soluble or alkali-soluble resin, for example, polyvinyl alcohol or a water-soluble acrylic resin and drying the coated resist to thereby form a film capable of preventing any polymerization inhibition by oxygen.

The color filter according to this embodiment can also be fabricated by an electrodeposition method, a transfer method or the like aside from the above-mentioned methods. The electrodeposition method is a method in which taking advantage of a transparent conductive film formed on a transparent substrate, a color filter is fabricated by the electrodeposition formation of varied-color filter segments on the transparent conductive film through the electrophoresis of colloidal particles. The transfer method is a method comprising forming in advance a color filter layer on the surface of a releasable transfer base sheet and then transferring this color filter layer onto a desired transparent substrate.

EXAMPLES

Some Examples of the present invention will be described below.

The present invention will be specifically described below by way of its examples. However, the gist of the present invention is in no way limited to these examples. Various changes and modifications can be made without departing from the spirit of the inventions. With respect to the compositions appearing in Examples, the contents without exception refer to mass ratios, and the parts are parts by mass.

[Preparation of Acrylic Resin Solution]

800 parts of cyclohexanone was placed in a reaction vessel and heated to 100° C. while introducing nitrogen gas in the vessel. While maintaining the temperature, a mixture of the following monomers and thermal polymerization initiator was dropped thereinto over a period of an hour, thereby performing a polymerization reaction.

| | |
|---|---|
| Styrene | 60.0 parts |
| Methacrylic acid | 60.0 parts |
| Methyl methacrylate | 65.0 parts |
| Butyl methacrylate | 65.0 parts |
| Azobisisobutyronitrile | 10.0 parts |

After the dropping, the reaction was continued at 100° C. for 3 hours. Thereafter, a solution of 2.0 parts of azobisisobutyronitrile in 50 parts of cyclohexanone was added thereto, and the reaction was further continued at 100° C. for an hour. Thus, a solution of acrylic resin whose weight average molecular weight was about 40,000 was obtained.

The solution was cooled to room temperature. The cooled resin solution was sampled in an amount of about 2 g and dried by heating at 180° C. for 20 minutes, and the nonvolatile content thereof was measured. Cyclohexanone was added to the above synthesized resin solution so that the nonvolatile content became 20%, thereby obtaining an intended acrylic resin solution.

Black, red, green and blue color compositions were prepared in the following manner.

[Preparation of Black Pigment 1]

A mixture of the following components was homogeneously blended, dispersed with glass beads of 1-mm diameter by means of a sand mill for 5 hours, and passed through a 5-μm filter. Thus, a dispersion of black pigment 1 was obtained.

| | |
|---|---|
| Red pigment: C.I. Pigment Red 254 ("Irgaphor Red B-CF" produced by Ciba Specialty Chemicals Inc.) | 31.6 parts |
| Blue pigment: C.I. Pigment Blue 15:6 ("Lionol Blue ES" produced by Toyo Ink Mfg. Co., Ltd.) | 34.2 parts |
| Carbon pigment ("#47" produced by Mitsubishi Chemical Corporation) | 11.1 parts |
| Dispersant ("Disperbyk-161" produced by BYK Chemie) | 5 parts |
| Acrylic varnish (solid content 20 mass %) | 72 parts |

[Preparation of Black Pigment 2]

A mixture of the following components was homogeneously blended, dispersed with glass beads of 1-mm diameter by means of a sand mill for 5 hours, and passed through a 5-μm filter. Thus, a dispersion of black pigment 2 was obtained.

| | |
|---|---|
| Red pigment: C.I. Pigment Red 254 ("Irgaphor Red B-CF" produced by Ciba Specialty Chemicals Inc.) | 39.6 parts |
| Blue pigment: C.I. Pigment Blue 15:6 ("Lionol Blue ES" produced by Toyo Ink Mfg. Co., Ltd.) | 42.8 parts |
| Dispersant ("Disperbyk-161" produced by BYK Chemie) | 5 parts |
| Acrylic varnish (solid content 20 mass %) | 72 parts |

[Preparation of Black Pigment 3]

A mixture of the following components was homogeneously blended, and agitated by means of a beads mill disperser. Thus, a dispersion of carbon black was obtained.

| | |
|---|---|
| Carbon pigment ("#47" produced by Mitsubishi Chemical Corporation) | 20 parts |
| Dispersant ("Disperbyk-161" produced by BYK Chemie) | 8.3 parts |
| Copper phthalocyanine derivative (produced by Toyo Ink Mfg. Co., Ltd.) | 1.0 part |
| Propylene glycol monomethyl ether acetate | 71 parts |

[Preparation of Black Composition 1]

A mixture of the following components was homogeneously blended, and passed through a 5-μm filter. Thus, a black color composition 1 was obtained.

| | |
|---|---|
| Black pigment 1 | 54.2 parts |
| Acrylic resin solution | 8 parts |
| Dipentaerythritol penta/hexaacrylate ("M-402" produced by Toagosei Co., Ltd.) | 4.7 parts |
| Photopolymerization initiator ("IRGACURE OXE 02" produced by Ciba Geigy) | 0.9 part |
| Sensitizer ("EAB-F" produced by Hodogaya Chemical Co., Ltd.) | 0.1 part |
| Leveling agent ("Disperbyk-163" produced by BYK Chemie) | 0.1 part |
| Cyclohexanone | 16 parts |
| Propylene glycol monomethyl ether acetate | 16 parts |

[Preparation of Black Composition 2]

A black composition 2 was prepared from the same components by the same procedure as in the preparation of black composition 1, except that the black pigment 2 was used as the dispersion.

[Preparation of Black Composition 3]

A mixture of the following components was homogeneously blended, and passed through a 5-μm filter. Thus, a black color composition 3 was obtained.

| | |
|---|---|
| Black pigment 3 | 25.2 parts |
| Acrylic resin solution | 18 parts |
| Dipentaerythritol penta/hexaacrylate ("M-402" produced by Toagosei Co., Ltd.) | 5.2 parts |

-continued

| | |
|---|---|
| Photopolymerization initiator ("IRGACURE OXE 02" produced by Ciba Geigy) | 1.2 part |
| Sensitizer ("EAB-F" produced by Hodogaya Chemical Co., Ltd.) | 0.3 part |
| Leveling agent ("Disperbyk-163" produced by BYK Chemie) | 0.1 part |
| Cyclohexanone | 25 parts |
| Propylene glycol monomethyl ether acetate | 25 parts |

[Preparation of Red Pigment 1]

A mixture of the following components was homogeneously blended, dispersed with glass beads of 1-mm diameter by means of a sand mill for 5 hours, and passed through a 5-μm filter. Thus, a dispersion of red pigment 1 was obtained.

| | |
|---|---|
| Red pigment: C.I. Pigment Red 254 ("Irgaphor Red B-CF" produced by Ciba Specialty Chemicals Inc.) | 8 parts |
| Red pigment: C.I. Pigment Red 177 ("Cromophtal Red A2B" produced by Ciba Specialty Chemicals Inc.) | 10 parts |
| Yellow pigment: C.I. Pigment Yellow 150 ("E4GN-GT" produced by LANXESS) | 2 parts |
| Dispersant ("ADISPER PB821" produced by Ajinomoto Fine-Techno Inc.) | 2 parts |
| Acrylic varnish (solid content: 20 mass %) | 108 parts |

[Preparation of Red Pigment 2]

A dispersion of red pigment 2 was prepared from a mixture of the following components in the same manner as in the preparation of the red pigment 1.

| | |
|---|---|
| Red pigment: C.I. Pigment Red 254 ("Irgaphor Red B-CF" produced by Ciba Specialty Chemicals Inc.) | 11 parts |
| Red pigment: C.I. Pigment Red 177 ("Cromophtal Red A2B" produced by Ciba Specialty Chemicals Inc.) | 9 parts |
| Dispersant ("ADISPER PB821" produced by Ajinomoto Fine-Techno Inc.) | 2 parts |
| Acrylic varnish (solid content: 20 mass %) | 108 parts |

[Preparation of Red Composition 1]

A mixture of the following components was homogeneously blended, and passed through a 5-μm filter. Thus, a red color composition was obtained.

| | |
|---|---|
| Red pigment 1 | 42 parts |
| Acrylic resin solution | 18 parts |
| Dipentaerythritol penta/hexaacrylate ("M-402" produced by Toagosei Co., Ltd.) | 4.5 parts |
| Photopolymerization initiator ("IRGACURE-907" produced by Ciba Specialty Chemicals Inc.) | 1.2 parts |
| Sensitizer ("EAB-F" produced by Hodogaya Chemical Co., Ltd.) | 2.0 parts |
| Cyclohexanone | 32.3 parts |

[Preparation of Red Composition 2]

A red composition 2 was prepared from the same components by the same procedure as in the preparation of red composition 1, except that the red pigment 2 was used as the dispersion.

[Preparation of Green Pigment 1]

A mixture of the following components was homogeneously blended, dispersed with glass beads of 1-mm diameter by means of a sand mill for 5 hours, and passed through a 5-μm filter. Thus, a dispersion of red pigment 1 was obtained.

| | |
|---|---|
| Green pigment: C.I. Pigment Green 58 ("Phthalocyanine Green A110" produced by DIC Corporation) | 10.4 parts |
| Yellow pigment: C.I. Pigment Yellow 150 ("E4GN-GT" produced by LANXESS) | 9.6 parts |
| Dispersant ("Disperbyk-163" produced by BYK Chemie) | 2 parts |
| Acrylic varnish (solid content: 20 mass %) | 66 parts |

[Preparation of Green Pigment 2]

A dispersion of green pigment 2 was prepared from a mixture of the following components in the same manner as in the preparation of the green pigment 1.

| | |
|---|---|
| Green pigment: C.I. Pigment Green 58 ("Phthalocyanine Green A110" produced by DIC Corporation) | 10.4 parts |
| Yellow pigment: C.I. Pigment Yellow 150 ("E4GN-GT" produced by LANXESS) | 3.2 parts |
| Yellow pigment: C.I. Pigment Yellow 138 | 7.4 parts |
| Dispersant ("Disperbyk-163" produced by BYK Chemie) | 2 parts |
| Acrylic varnish (solid content: 20 mass %) | 66 parts |

[Preparation of Green Pigment 3]

A dispersion of green pigment 3 was prepared from a mixture of the following components in the same manner as in the preparation of the green pigment 1.

| | |
|---|---|
| Green pigment: C.I. Pigment Green 36 ("Lionol Green 6YK" produced by Toyo Ink Mfg. Co., Ltd.) | 10.4 parts |
| Yellow pigment: C.I. Pigment Yellow 150 ("E4GN-GT" produced by LANXESS) | 9.6 parts |
| Dispersant ("Disperbyk-163" produced by BYK Chemie) | 2 parts |
| Acrylic varnish (solid content: 20 mass %) | 66 parts |

[Preparation of Green Composition 1]

A mixture of the following components was homogeneously blended, and passed through a 5-μm filter. Thus, a red color composition was obtained.

| | |
|---|---|
| Green pigment 1 | 46 parts |
| Acrylic resin solution | 8 parts |
| Dipentaerythritol penta/hexaacrylate ("M-402" produced by Toagosei Co., Ltd.) | 4 parts |
| Photopolymerization initiator ("IRGACURE OXE 02" produced by Ciba Geigy) | 1.2 parts |
| Photopolymerization initiator ("IRGACURE-907" produced by Ciba Specialty Chemicals Inc.) | 3.5 parts |
| Sensitizer ("EAB-F" produced by Hodogaya Chemical Co., Ltd.) | 1.5 parts |
| Cyclohexanone | 5.8 parts |
| Propylene glycol monomethyl ether acetate | 30 parts |

[Preparation of Green Composition 2]

A green composition 2 was prepared from the same components by the same procedure as in the preparation of green composition 1, except that the green pigment 2 was used as the dispersion.

[Preparation of Green Composition 3]

A green composition 3 was prepared from the same components by the same procedure as in the preparation of green composition 1, except that the green pigment 3 was used as the dispersion.

[Preparation of Blue Pigment 1]

A mixture of the following components was homogeneously blended, dispersed with glass beads of 1-mm diameter by means of a sand mill for 5 hours, and passed through a 5-μm filter. Thus, a dispersion of blue pigment was obtained.

| | |
|---|---|
| Blue pigment: C.I. Pigment Blue 15:6 ("Lionol Blue ES" produced by Toyo Ink Mfg. Co., Ltd.) | 52 parts |
| Dispersant ("SOLSPERSE 20000" produced by Zeneca Limited) | 6 parts |
| Acrylic varnish (solid content 20 mass %) | 200 parts |

[Preparation of Blue Pigment 2]

A mixture of the following components was homogeneously blended, dispersed with glass beads of 1-mm diameter by means of a sand mill for 5 hours, and passed through a 5-μm filter. Thus, a dispersion of blue pigment was obtained.

| | |
|---|---|
| Blue pigment: C.I. Pigment Blue 15:6 ("Lionol Blue ES" produced by Toyo Ink Mfg. Co., Ltd.) | 49.4 parts |
| Dispersant ("SOLSPERSE 20000" produced by Zeneca Limited) | 6 parts |
| Acrylic varnish (solid content 20 mass %) | 200 parts |

This dispersion was loaded with the following violet dye powder, and agitated well, thereby obtaining a blue pigment 2.

| | |
|---|---|
| Violet dye: NK-9402 produced by Hayashibara Biochemical Laboratories | 2.6 parts |

[Preparation of Blue Composition 1]

Thereafter, a mixture of the following components was homogeneously blended, and passed through a 5-μm filter. Thus, a blue color composition was obtained.

| | |
|---|---|
| Blue pigment 1 | 16.5 parts |
| Acrylic resin solution | 25.3 parts |
| Dipentaerythritol penta/hexaacrylate ("M-402" produced by Toagosei Co., Ltd.) | 1.8 parts |
| Photopolymerization initiator ("IRGACURE-907" produced by Ciba Specialty Chemicals Inc.) | 1.2 parts |
| Sensitizer ("EAB-F" produced by Hodogaya Chemical Co., Ltd.) | 0.2 part |
| Cyclohexanone | 25 parts |
| Propylene glycol monomethyl ether acetate | 30 parts |

[Fabrication of Color Filter]

Color filters were fabricated by combining obtained color compositions through the following procedure.

It should be noted that schematic cross sections of two forms of color filter substrates according to the following Examples are shown in FIG. 3 and FIG. 4. In these figures, each of the color filters is shown with its film surface facing downward. In the actual fabrication process, however, fabrication is processed with the film surface facing upward.

Example 1

First, the black color composition 1 was applied on a glass substrate 10 as shown in FIG. 3 by a spin coating method so that the film thickness was 2.0 μm, and prebaked in a clean oven at 70° C. for 20 minutes. Subsequently, the resultant substrate was cooled to room temperature, and exposed to ultraviolet rays through a photomask by means of an ultrahigh pressure mercury lamp. Thereafter, the substrate was developed by spraying an aqueous solution of sodium carbonate held at 23° C., rinsed with ion-exchanged water, and dried in air. Further, the substrate was postbaked in a clean oven at 230° C. for 30 minutes. Thus, a stripe-patterned black matrix BM was provided on the substrate.

Subsequently, in the same manner, the red color composition 1 was applied by a spin coating method so that the film thickness was 2.8 μm, dried, exposed by means of an exposure apparatus so as to obtain a stripe-patterned color layer, and developed. Thus, red pixels R were provided.

Thereafter, also in the same manner, the green color composition 1 was applied by a spin coating method so that the film thickness was 2.8 μm, dried, exposed by means of an exposure apparatus so that a stripe-patterned color layer was formed in a place other than that of the red pixels, and developed. Thus, green pixels G were provided in a position adjacent to the red pixels R.

Moreover, in exactly the same manner as in the formation of the red and green pixels, blue pixels B were formed through the application of the blue color composition 1 in a film thickness of 2.8 μm in a position adjacent to the red pixels R and green pixels G.

As a result, there was obtained a color filter substrate comprising three-color-stripe patterned color pixels including the red pixels R, green pixels G and blue pixels B provided on the transparent substrate 10, as shown in FIG. 3.

Example 2

In the same manner as in Example 1, a color filter substrate was fabricated using the black color composition 2, red color composition 2, green color composition 2 and blue color composition 2.

In Example 2, referring to FIG. 4, a frame portion F was formed of a light-shielding layer (same material and process as for the black matrix) of about 3 mm width so as to surround effective display regions of liquid crystal. A red layer 3 and a blue layer 4 were superimposed on the frame portion F. The light-shielding property of the frame portion F comprised of a black matrix material can be supplemented by the superimposition of the red layer 3 and blue layer 4, so that an optical density of 3 or higher can be ensured. These two color layers can be formed while regulating the thickness thereof, for example, by use of a halftone mask. The relative dielectric constant of the blue layer 4 is smaller than those of other color layers, so that in the stacking of color layers, it is advantageous to superimpose the blue layer 4 on a side close to the liquid crystal.

Although not shown in the figures, a spacer comprised of, superimposed one upon another, a red layer, green layer and blue layer was provided in accordance with the thickness of a liquid crystal layer to be incorporated in a liquid crystal display device. The relative dielectric constant of the blue layer is smaller than those of other color layers, as mentioned above, so that the blue layer can be used as an uppermost layer of the layer-stacked spacer. Further, the blue layer can be provided so as to cover the spacer.

Example 3

Figure 5:
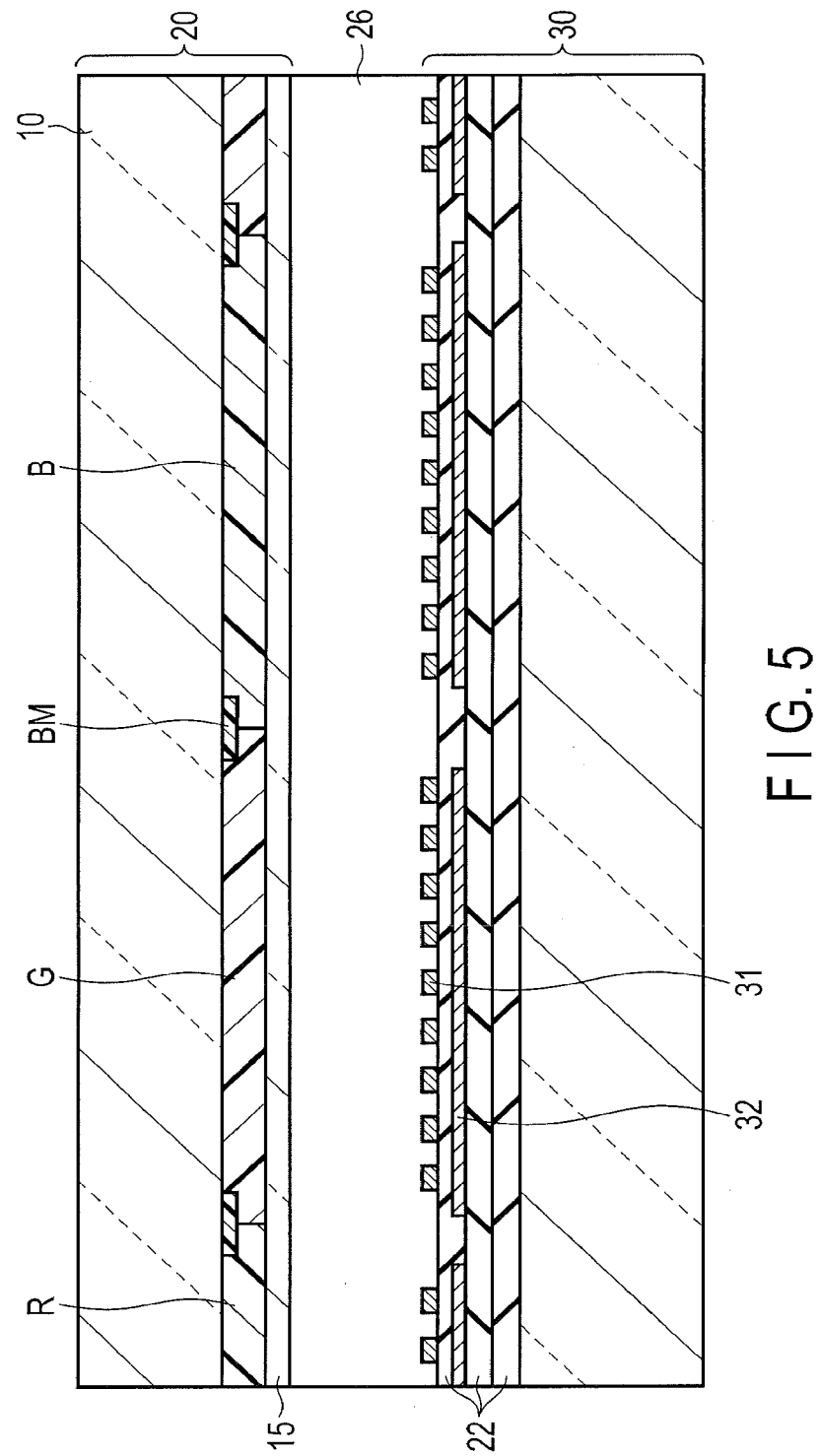
FIG. 5 shows a schematic cross section of a liquid crystal display according to Example 3 of the present invention.

A cross section of an FFS mode liquid crystal display device according to this Example is shown in FIG. 5.

The color filter substrate 20 used in this Example was the color filter substrate shown in FIG. 4 of Example 2. In an array substrate 30 comprising active elements (TFTs), a pixel electrode 31 was disposed through an insulating layer 22 on a solid-formed common electrode 32. The TFTs, an alignment film, a polarizer, a retarder, etc., are not shown.

The color filter substrate 20 and the array substrate 30 were bonded to each other in opposite relationship through a liquid crystal 26 whose dielectric constant anisotropy was 4.5 (liquid crystal with a positive dielectric constant anisotropy). The alignment film not shown underwent rubbing treatment, thereby realizing a liquid crystal alignment horizontal to the substrate surface. The pixel electrode 31 had a comb-shaped pattern perpendicular to the sheet. The rubbing direction thereof was not completely parallel to the line of the comb pattern, and rubbing was performed at an angle deviated therefrom by about 5 degrees.

Comparative Example

In the same manner as in Example 1, a color filter substrate was fabricated using the black color composition 3, red color composition 1, green color composition 3 and blue color composition 1.

Table 1 below shows the relative dielectric constant values of individual color layers, together with color resist compositions, employed in Example 1, Example 2 and Comparative Example.

Moreover, carbon was used as the black pigment of the black matrix in Comparative Example. The relative dielectric constant values measured at frequencies of 120, 240 and 480 Hz of the black color layer (BM) in Comparative Example were as large as 16.2, 16.1 and 15.5, respectively, and the differences thereof from the relative dielectric constants of the red layer were as extremely large as 12.6, 12.5 and 12.0, respectively.

A color filter substrate was formed by using the color resists (color compositions) and black color composition (BM) of the formulations indicated in Table 1 above. This color filter substrate was bonded to an array substrate through a liquid crystal of 4.5 dielectric constant anisotropy in the same manner as in Example 3, thereby obtaining a liquid crystal display device of Comparative Example.

In each of the liquid crystal display device of Example 3 and the liquid crystal display device of Comparative Example, a driving voltage was applied between the pixel electrode and common electrode of the array substrate, thereby displaying images. On the liquid crystal display device of Example 3, there was no display failure and images of excellent quality were obtained. By contrast, on the liquid crystal display device of Comparative Example, red unevenness and light leakage at pixel aperture edges were observed.

TABLE 1

| Evaluation result | | Example 1 | | | | Example 2 | | | |
|---|---|---|---|---|---|---|---|---|---|
| | | BM | Red | Green | Blue | BM | Red | Green | Blue |
| Pigment | | black pigment 1 | red pigment 1 | green pigment 1 | blue pigment 1 | black pigment 2 | red pigment 2 | green pigment 2 | blue pigment 2 |
| Composition | | black comp. 1 | red comp. 1 | green comp. 1 | blue comp. 1 | black comp. 2 | red comp. 2 | green comp. 2 | blue comp. 2 |
| Chromaticity | x | — | 0.618 | 0.31 | 0.135 | — | 0.618 | 0.311 | 0.141 |
| | y | — | 0.326 | 0.56 | 0.118 | — | 0.323 | 0.56 | 0.118 |
| OD value | (/μm) | 2 | — | — | — | 1.6 | — | — | — |
| Relative dielectric constant | 120 Hz | 4.1 | 3.6 | 3.7 | 3.8 | 3.5 | 3.2 | 3.5 | 3.1 |
| | 240 Hz | 4.1 | 3.6 | 3.7 | 3.8 | 3.5 | 3.2 | 3.4 | 3 |
| | 480 Hz | 4 | 3.5 | 3.7 | 3.7 | 3.5 | 3.2 | 3.4 | 3 |

| | | | Comparative Example 1 | | |
|---|---|---|---|---|---|
| Evaluation result | | BM | Red | Green | Blue |
| Pigment | | black pigment 3 | red pigment 1 | green pigment 3 | blue pigment 1 |
| Composition | | black comp. 3 | red comp. 1 | green comp. 3 | blue comp. 1 |
| Chromaticity | x | — | 0.618 | 0.313 | 0.135 |
| | y | — | 0.326 | 0.56 | 0.118 |
| OD value | (/μm) | 2.2 | — | — | — |
| Relative dielectric constant | 120 Hz | 16.2 | 3.6 | 4.6 | 3.8 |
| | 240 Hz | 16.1 | 3.6 | 4.5 | 3.8 |
| | 480 Hz | 15.5 | 3.5 | 4.5 | 3.7 |

As apparent from Table 1 above, all the relative dielectric constant values measured at frequencies of 120, 240 and 480 Hz of the red layer, green layer and blue layer used in each of Examples 1 and 2 fell within the range of 2.9 to 4.4. These relative dielectric constant values fall within ±0.3 of the average relative dielectric constant of the red layer, green layer and blue layer.

In contrast, the main coloring agent of the green layer in Comparative Example was a halogenated copper phthalocyanine green pigment. The relative dielectric constant values measured at frequencies of 120, 240 and 480 Hz of the color layer were as large as 4.6, 4.5 and 4.5, respectively, thereby being outside the range of 2.9 to 4.4. The differences thereof from the average relative dielectric constant values of 4.0, 4.0 and 3.9 at respective frequencies of the red layer, green layer and blue layer were as large as 0.6, 0.5 and 0.6, respectively, thereby being outside ±0.3 of the average.

What is claimed is:

1. A color filter substrate for use in a fringe-field switching mode liquid crystal display wherein the color filter substrate and an array substrate provided with a comb-shaped pixel electrode having an electrode width of 10 μm or less are arranged facing each other with a liquid crystal layer interposed therebetween, the color filter substrate comprising:

a transparent substrate;

a black matrix provided on the transparent substrate, comprising an organic pigment as a main coloring agent;

color pixels which contain a red pixel, a green pixel, and a blue pixel and are provided in regions partitioned by the black matrix on the transparent substrate, each of the color pixels having a relative dielectric constant of 2.9 or more but 4.4 or less, as measured at a frequency at which the liquid crystal display is driven; and a transparent resin layer provided on the red pixel, the green pixel and the blue pixel, wherein the relative dielectric constant of each of the color pixels falls within ±0.3 of an average relative dielectric constant of the red pixel, the green pixel and the blue pixel, a coloring agent of the black matrix comprises the organic pigment in an amount of 92 mass % or more based on a whole amount of the coloring agent, and comprises carbon as a balance, and a main coloring agent of the green pixel is a halogenated zinc-phthalocyanine pigment.

2. The color filter substrate according to claim 1, wherein a relative dielectric constant of the black matrix, as measured at a frequency at which the liquid crystal display is driven, is 2.9 or more but 4.4 or less.

3. The color filter substrate according to claim 1, wherein a relative dielectric constant of the black matrix, as measured at a frequency at which the liquid crystal display is driven, is smaller than a value of dielectric constant anisotropy exhibited by a material of the liquid crystal layer.

4. The color filter substrate according to claim 1, wherein the average relative dielectric constant of the red pixel, the green pixel and the blue pixel is smaller than a value of dielectric constant anisotropy exhibited by a material of the liquid crystal layer.

5. The color filter substrate according to claim 1, wherein the frequency applied in the measuring of the relative dielectric constant is a frequency ranging from 120 to 480 Hz.

6. The color filter substrate according to claim 1, wherein the black matrix includes a first portion having a pattern shape configured to partition the color pixels in a lattice form or partition the color pixels in a stripe form and further includes a second portion having a frame pattern surrounding an effective display region of the liquid crystal display, and on the second portion, one of a blue layer used made of the same material as that of the blue pixel and a red layer made of the same material as that of the red pixel is formed, or two thereof are superimposed one upon the other.

7. The color filter substrate according to claim 1, wherein the black matrix includes a first portion having a pattern shape configured to partition the color pixels in a lattice form or partition the color pixels in a stripe form and further includes a second portion having a frame pattern surrounding an effective display region of the liquid crystal display, and a red layer made of the same material as that of the red pixel and a blue layer made of the same material as that of the blue pixel are superimposed in this order one upon the other on the second portion.

8. A fringe-field switching mode liquid crystal display comprising the color filter substrate according to claim 1.

9. A fringe-field switching mode liquid crystal display comprising:

a color filter substrate comprising a transparent substrate, a black matrix provided on the transparent substrate, color pixels which contain a red pixel, a green pixel, and a blue pixel and are provided in regions partitioned by the black matrix on the transparent substrate, each of the color pixels having a relative dielectric constant of 2.9 or more but 4.4 or less as measured at a frequency at which the liquid crystal display is driven, and a transparent resin layer provided on the red pixel, the green pixel and the blue pixel, wherein the relative dielectric constant of each of the color pixels falls within ±0.3 of an average relative dielectric constant of the red pixel, the green pixel and the blue pixel;

an array substrate disposed facing the color filter substrate, and provided with a comb-shaped pixel electrode having an electrode width of 10 μm or less; and a liquid crystal layer interposed between the color filter substrate and the array substrate, wherein a coloring agent of the black matrix comprises an organic pigment in an amount of 92 mass % or more based on a whole amount of the coloring agent and comprises carbon as a balance, and a main coloring agent of the green pixel is a halogenated zinc-phthalocyanine pigment.

10. The fringe-field switching mode liquid crystal display according to claim 9, wherein the electrode width of the comb-shaped pixel electrode is 2 μm or more but 5 μm or less.

11. The liquid crystal display according to claim 9, wherein a relative dielectric constant of the black matrix, as measured at a frequency at which the liquid crystal display is driven, is 2.9 or more but 4.4 or less.

12. The liquid crystal display according to claim 9, wherein a relative dielectric constant of the black matrix, as measured at a frequency at which the liquid crystal display is driven, is smaller than a value of dielectric constant anisotropy exhibited by a material of the liquid crystal layer.

13. The liquid crystal display according to claim 9, wherein the average relative dielectric constant of the red pixel, the green pixel and the blue pixel is smaller than a value of dielectric constant anisotropy exhibited by a material of the liquid crystal layer.

14. The liquid crystal display according to claim 9, wherein the frequency applied in the measuring of the relative dielectric constant is a frequency ranging from 120 to 480 Hz.

15. The liquid crystal display according to claim 9, wherein the black matrix includes a first portion having a pattern shape configured to partition the color pixels in a lattice form or partition the color pixels in a stripe form and further includes a second portion having a frame pattern surrounding an effective display region of the liquid crystal display, and on the second portion, one of a blue layer made of the same material as that of the blue pixel and a red layer made of the same material as that of the red pixel is formed, or two thereof are superimposed one upon the other.

16. The liquid crystal display according to claim 9, wherein the black matrix includes a first portion having a pattern shape configured to partition the color pixels in a lattice form or partition the color pixels in a stripe form and further includes a second portion having a frame pattern surrounding an effective display region of the liquid crystal display, and a red layer made of the same material as that of the red pixel and a blue layer made of the same material as that of the blue pixel are superimposed in this order one upon the other on the frame pattern.

\* \* \* \* \*